United States Patent [19]
Roehling

[11] Patent Number: 5,403,202
[45] Date of Patent: Apr. 4, 1995

[54] LOW INSERTION FORCE/LOW PROFILE FLEX CONNECTOR

[75] Inventor: Donald P. Roehling, Boise, Id.

[73] Assignee: Hewlett-Packard Company, Palo Alto, Calif.

[21] Appl. No.: 134,166

[22] Filed: Oct. 7, 1993

[51] Int. Cl.6 .......................... H01R 9/07; H01R 9/09
[52] U.S. Cl. .................................. 439/493; 439/496; 439/632
[58] Field of Search ........................... 439/492–496, 439/499, 632, 67, 77, 629, 630, 636, 637

[56] References Cited

U.S. PATENT DOCUMENTS

| 4,264,114 | 4/1981 | Chandler | 439/637 |
| 4,691,942 | 9/1987 | Gordon | 439/493 |
| 4,971,575 | 11/1990 | Martellotti | 439/496 |
| 5,009,607 | 4/1991 | Gordon et al. | 439/67 |
| 5,040,997 | 8/1991 | Garner | 439/77 |

FOREIGN PATENT DOCUMENTS 404206374A  7/1992  Japan .................. 439/492

Primary Examiner—Steven C. Bishop
Attorney, Agent, or Firm—E. F. Oberheim

[57] ABSTRACT

A low insertion force, low profile electrical connector employs the folded end of a planar flexible circuit as the electrical connector plug which is plugged into an electrical connector receptacle having a printed circuit board and printed circuit traces as a part of the electrical connector receptacle. Contact pads connected with flexible circuit traces on the electrical connector plug engage contacts connected to the printed circuit traces in the electrical connector receptacle.

3 Claims, 5 Drawing Sheets

LOW INSERTION FORCE/LOW PROFILE FLEX CONNECTOR

TECHNICAL FIELD

This invention relates to electrical connectors and particularly to electrical connectors having a low insert force and a low profile.

BACKGROUND OF THE INVENTION

Numerous applications in electronics require electrical connectors that are very small. Such electrical connectors can be characterized by connections between printed circuit boards and flexible circuits. In disk drives, for example, sizes have been reduced dramatically in just a few years. Drives of 1.3 form factor which are about 3-4 millimeters in thickness are currently available. In such a small disk drive, application, the electrical interconnection system between the head/-disk assembly (HDA) and the printed circuit board assembly (PCA) has become a difficult challenge. Such an interconnection requires connecting a planar flexible circuit to a printed circuit board.

Existing circuit interconnection technology has proven to be inapplicable in these circumstances. Zero force connectors have a profile which is too high. The direct connection of the head/disk assembly flexible circuit to the printed circuit assembly employing soldering techniques, while feasible, is undesirable, since it inhibits rework. Pin connectors are also too large for many such applications because of the pin pitch.

SUMMARY OF THE INVENTION

This invention provides a structurally simplified electrical connector for connecting a planar flexible circuit to a printed circuit board. The electrical connector has a very low profile and a low insertion force requirement. This low insertion force, low profile electrical connector comprises an electrical connector plug formed by the folded end of a substantially planar flexible circuit and an electrical connector receptacle for receiving the electrical connector plug, in which the printed circuit board forms a part of the electrical connector receptacle.

According to the presently known best mode for practicing this invention, an electrical connector plug is formed of a folded planar flexible circuit. The flexible circuit has laterally spaced flexible circuit traces and in the folded end of the flexible circuit has opposite outer electrical connector plug surfaces. The flexible circuit traces terminate in contacts on both of the outer electrical connector plug surfaces. Alternate flexible circuits are terminated by contacts on that outer electrical connector plug surface of this flexible circuit before the folded end. Flexible circuit traces intermediate these alternate flexible circuit traces continue around the folded end to contacts on the remaining outer electrical connector plug surface whereat these intermediate flexible circuit traces are terminated. The contacts on these opposite outer electrical connector plug surfaces are aligned in the paths of the respective flexible circuit traces and are formed as contact pads which are slightly wider than the circuit traces.

The electrical connector receptacle has confronting, opposite electrical receptacle faces. One opposite electrical receptacle face comprises the printed circuit board to which the folded end of the planar flexible circuit is to be connected. Alternate printed circuit traces on the printed circuit board are terminated at contacts on the end face of the printed circuit board. This end face of the printed circuit board is one electrical receptacle face. Printed circuit traces intermediate these alternate printed circuit traces are terminated in contacts at a different location on the printed circuit board. A structure mounted to the printed circuit board has an electrical receptacle face opposite to the end face of the printed circuit board. Electrical connector strips are mounted to this receptacle face. The ends of these electrical connector strips are connected to the contacts of the intermediate printed circuit traces at the location on the printed circuit board where they are terminated.

The electrical connector receptacle receives the electrical connector plug which, as described, is the folded end of the planar flexible circuit. The opposite outer electrical connector plug surfaces are compressed between the opposite electrical receptacle faces of the electrical connector receptacle. In this physical relationship, the contacts on the folded end of the planar flexible circuit are aligned with and in contact with contacts of the printed circuit board on the opposite receptacle faces of the electrical connector receptacle, in which position the flexible circuit traces of the planar flexible circuit are connected with the printed circuit traces of the printed circuit board.

The folded end of the planar flexible circuit, functioning as the electrical connector plug, has a degree of resilience in compression between the opposite electrical receptacle faces. This resilience may result from the flexibility of the planar flexible circuit as folded. In such a structure, the diameter of the folded end is chosen to be slightly less than the distance between the opposite electrical receptacle faces of the electrical connector receptacle. Behind the folded end, the planar flexible circuit is outwardly bowed so that the distance between the outer electrical connector plug surfaces is greater than the distance between the opposite receptacle faces. The end of the planar flexible circuit behind the bend is joined to the body of the planar flexible circuit a dimension between the opposite outer electrical connector plug surfaces at that location which is slightly less than the dimension between the opposite electrical receptacle faces. Insertion of this construction of the folded end of the planar flexible circuit into the electrical connector receptacle, result in displacement of the outwardly bowed opposite outer electrical connector plug surfaces toward one another between the opposite receptacle faces. The force required to affect this displacement provides the contact force between the mating contacts in this connector assembly.

A preferred construction, however, which represents the presently known best mode for practicing this invention, is to employ a foam type of elastomeric spacer bonded between the sections of the flexible circuit at the folded end. Another approach would be to use a dispensed (liquid) material which solidifies with the desired properties. For example: silicone gasket material which can be purchased at any hardware store in tube form. Such a material would provide the required spring properties and secure the flexible circuit in a folded position. In these constructions, again, the dimension across the opposite outer electrical connector plug surfaces is slightly greater than the distance between the opposite receptacle faces in the electrical connector receptacle. With these constructions, positive contact between the mating contacts of the plug and the receptacle is guaranteed and by careful selection of the elastomeric material and dimensioning of the spacing between the opposite outer electrical connector plug surfaces, the desired low insertion force can be obtained.

BRIEF DESCRIPTION OF THE DRAWINGS

The invention will be better understood by reference to the following descriptive disclosure when considered in conjunction with the accompanying drawings, in which.

DESCRIPTION OF THE PREFERRED EMBODIMENTS

Figure 1:
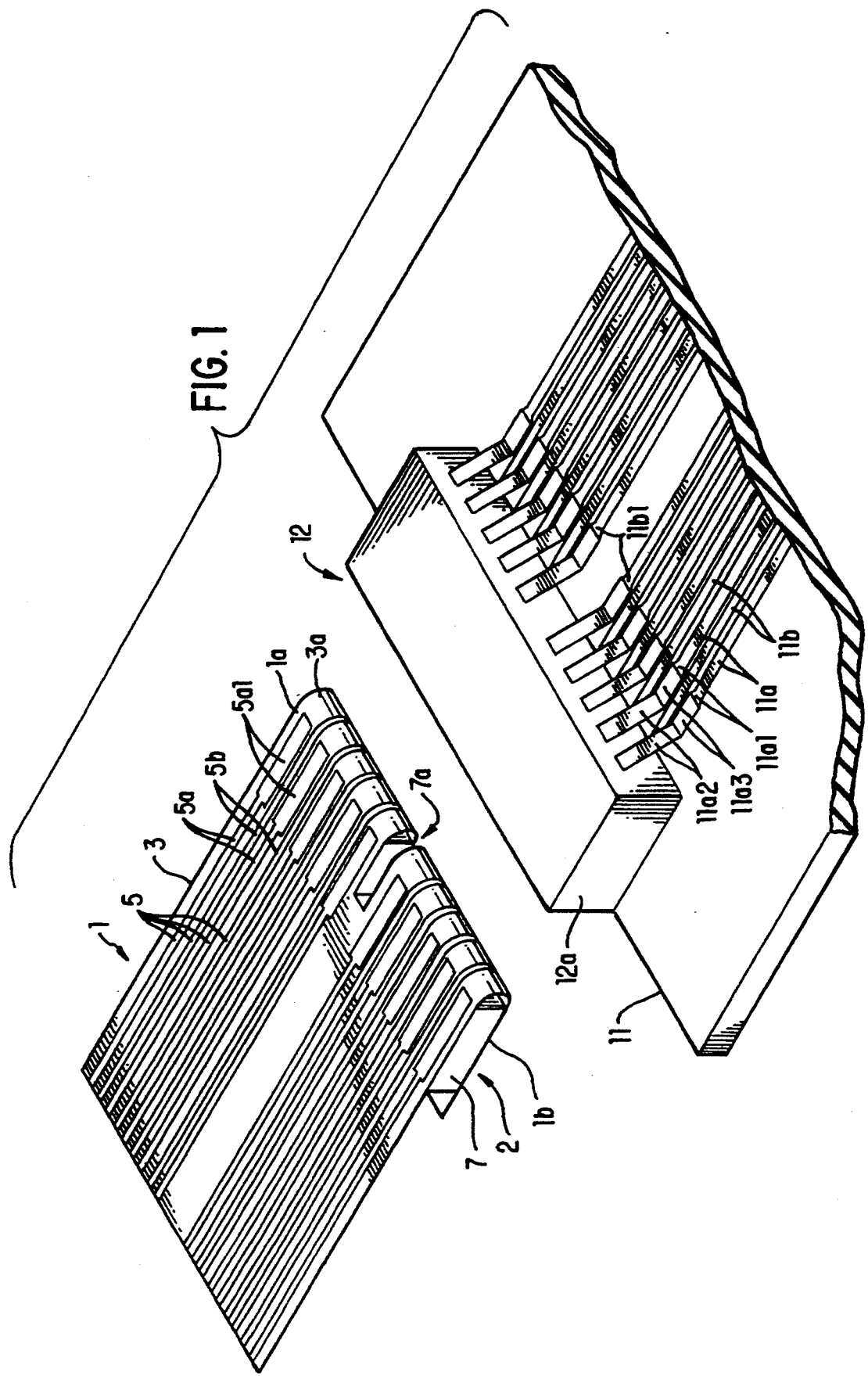
FIG. 1 is an isometric illustration of an electrical connector embodying the principles of this invention.

Simplification of an electrical connector structure is achieved according to this invention by utilizing the electrical parts or structures which are to be joined together as physical, functional parts of the electrical connector. In the illustrative embodiment of this invention, those functional parts comprise a planar flexible circuit 1 and a printed circuit board assembly 11. As seen in FIG. 1, the folded end of the planar flexible circuit 1 defines an electrical connector plug 2 and the printed circuit board 11 is a functional part of an electrical connector receptacle 12.

Referring now to FIGS. 1 through 7, the electrical connector plug 2 is described. This electrical connector plug comprises a planar flexible circuit 1 which includes a mylar strip 3 having a plurality of flexible circuit traces 5 thereon. The mylar strip 3 is transversely folded at 3a about a pre cut resilient or elastic insert 7 of any suitable elastomeric material. The mylar strip 3 is bonded to the elastic insert 7 to form a double sided electrical connector plug having opposite outer electrical connector plug surfaces 1a and 1 b respectively. Alternatively, the folded end may be held in a mold shaped to the outer surface of the electrical connector plug surfaces and a foam material such as a silicone gasket material into the mold. The foam material bonds to the mylar strip to form the elastomeric insert.

Figure 3:
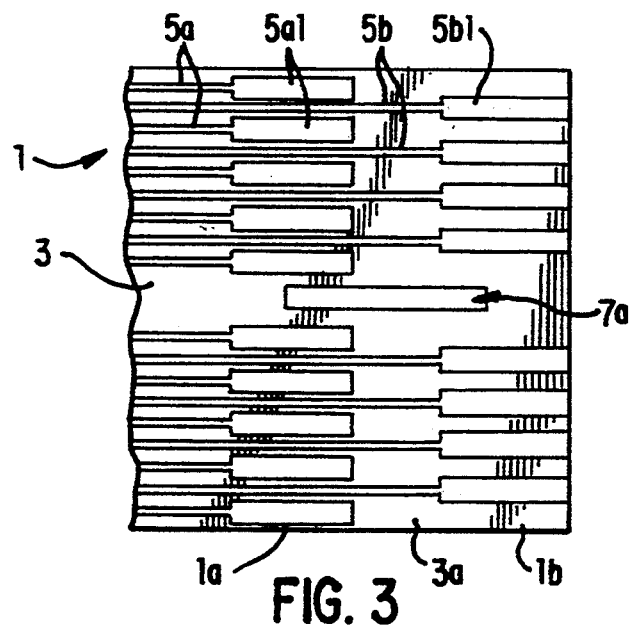
FIG. 3 is a fiat development of the planar flexible circuit showing the flat layout of the flexible circuit traces and the contact pads associated therewith prior to folding.
Figure 4:
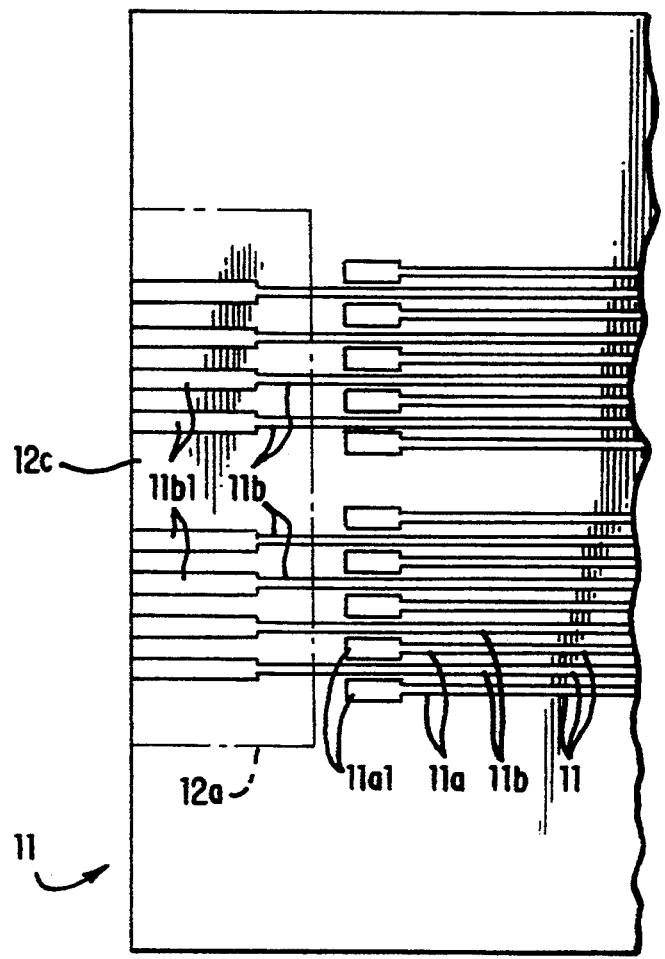
FIG. 4 is a plan view of the printed circuit board which forms part of the electrical connector receptacle, showing the layout of the printed circuit traces and the contact pads which are associated therewith.
Figure 5:
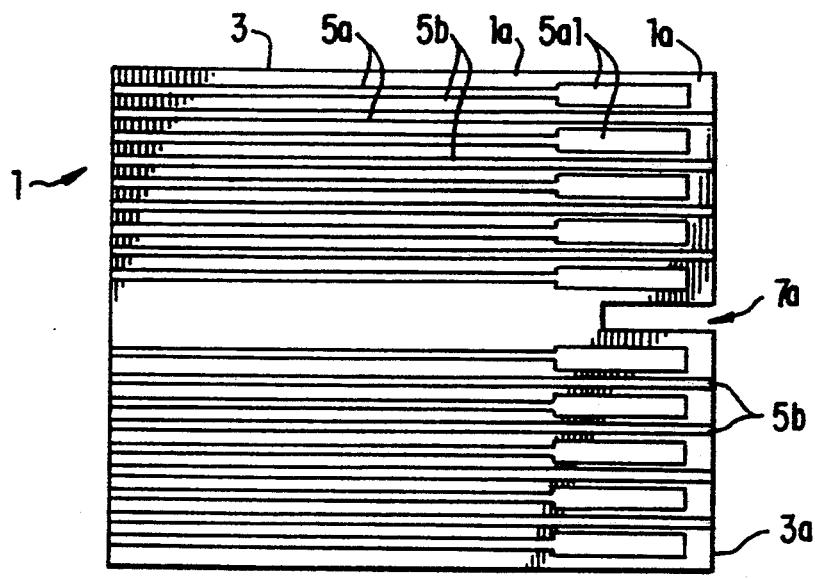
FIGS. 5, 6 and 7 are respectively top, edge and bottom views of the electrical connector plug formed in the folded end of the planer flexible circuit.
Figure 6:
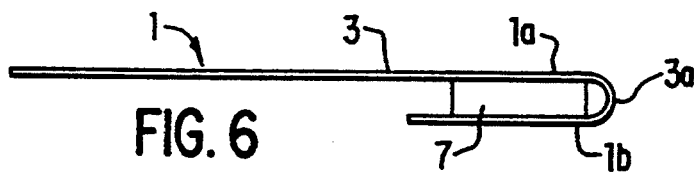
Figure 7:
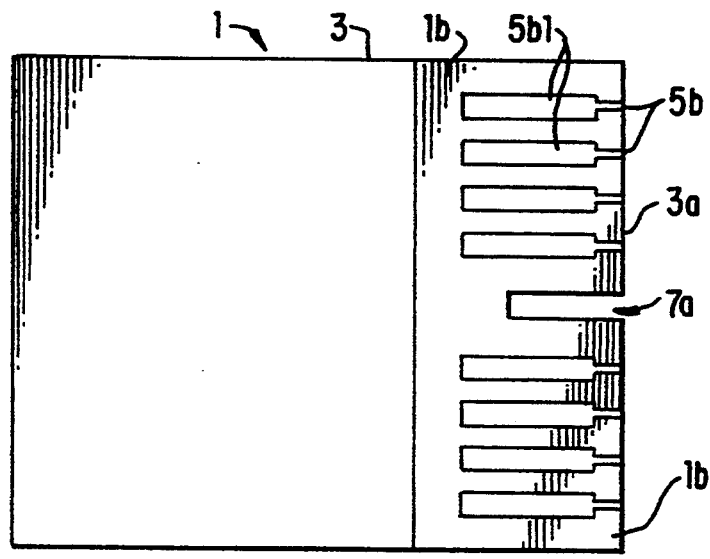

Referring now additionally to FIGS. 3 through 6a for details of the flexible circuit traces and the contact pads on the opposite electrical connector plug surfaces 1a and 1b, it will be seen that alternate flexible circuit traces 5a on the top electrical connector plug surface 1a are terminated in contact pads 5a1 adjacent the folded end 3a of the mylar strip 3. Intermediate flexible circuit traces 5b, as best seen in FIGS. 1, 5 and 6 pass, between the contact pads 5a1 and wrap around the folded end 3a of the mylar strip and terminate in contact pads 5b1 (FIG. 7) on the bottom electrical connector plug surface 1b. The flat developed layout of the flexible circuit traces 5a, 5b and contact pads 5a1, 5b1 is best seen in FIG. 3. The section of this flat layout which constitutes the folded edge 3a is identified in FIG. 3 and occupies the space between the contact pads 5a1 and the contact pads 5b1.

The thickness of the electrical connector plug 2 measured between the electrical connector plug surfaces 1a and 1b is slightly larger than the corresponding dimension between the opposite electrical receptacle faces on the electrical connector receptacle. As noted, the elastomeric insert 7 has a degree of resilience which permits compressing the plug electrical connector plug 2 in thickness as it is inserted into the electrical connector receptacle 12. The resulting contact force engaging the contact pads of the electrical connector plug 2 with those of the electrical connector receptacle is a function of the amount of deflection or compression of the elastomeric material and the spring rate of that material. Ideally with fiat contact pads on both the electrical connector plug and in the electrical connector receptacle, electrical contact is made over the entire surface of the engaged contact pads. It will be observed however, that this contact area is considerably greater than the cross sectional area of the flexible connector tracers 5a and 5b; thus, the lack of uniform contact between engaged contact pad faces does not pose a problem as far as the electrical connection itself is concerned.

Figure 6A:
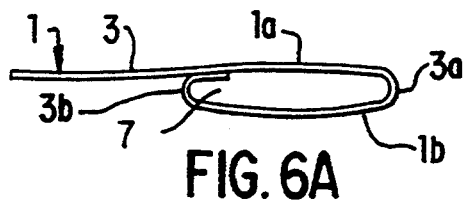
FIG. 6A is an edge view of a modification of the electrical connector plug.
Figure 8:
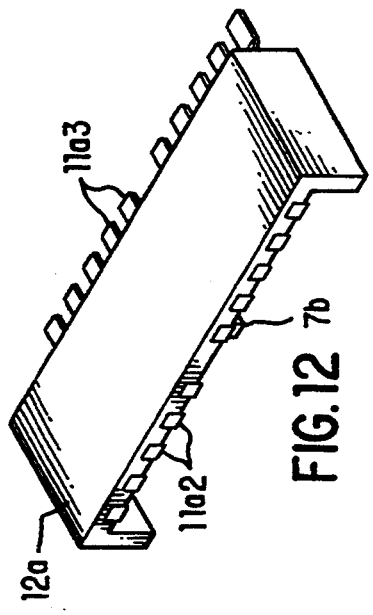
FIGS. 8, 9, 10, 11 and 12 are respectively top, front, bottom, end and isometric views of the upper section of the electrical connector receptacle.

As an alternative to the fiat contact configuration of FIG. 6 attention is directed to FIG. 6A. Here, electrical connector plug outer surfaces 1a and 1b are slightly outwardly bowed or, stated otherwise, provided with convex surfaces. Here, the folded end 3a of the mylar strip is of slightly less diameter than the corresponding dimension of the electrical connector receptacle 12 so that it is easily fitted within the receptacle opening. The dimension across the convex outer surfaces 1a and 1b of the electrical connector plug 2, however, is greater than that corresponding dimension of the electrical connector receptacle 12. Thus, upon insertion of the electrical connector plug 2 into the electrical connector receptacle 12 the surfaces 1a and 1b are deflected inwardly and thus, while providing, a reduced area of contact, as compared to the fiat contact surfaces, provide positive contact engagement in that reduced area. There are two ways in which spring loading of these electrical connector plug outer contact surfaces may take place. If the mylar strip 3 of the, flexible circuit 1 is of sufficient thickness, the convex formation of the opposite outer electrical connector plug surfaces 1a and 1b is sufficient to provide the needed contact engagement force to provide positive electrical connection. Thus, in this configuration, the electrical connector plug 2 comprises a folded end of the mylar strip having the folded contact ends the connector ends 3a, 3b which may be heat formed and the end 3b of the mylar strip adjacent the trailing end of the electrical connector plug 2 is adhesively bonded to the upper section of the flexible circuit at that location.

In the event, however, that the contact force provided by the convex outer electrical connector plug surfaces 1a and 1b is insufficient to provide the required contact force an elastomeric insert 7, configured in cross section as seen in FIG. 6a, and fabricated as described above, may be included in the construction of the electrical connector plug 2. When so constructed, the folded end 3b of the mylar strip 3 is not required and the open ended termination of the electrical connector plug 2 may be similar to that which is seen in FIG. 6.

Figure 2:
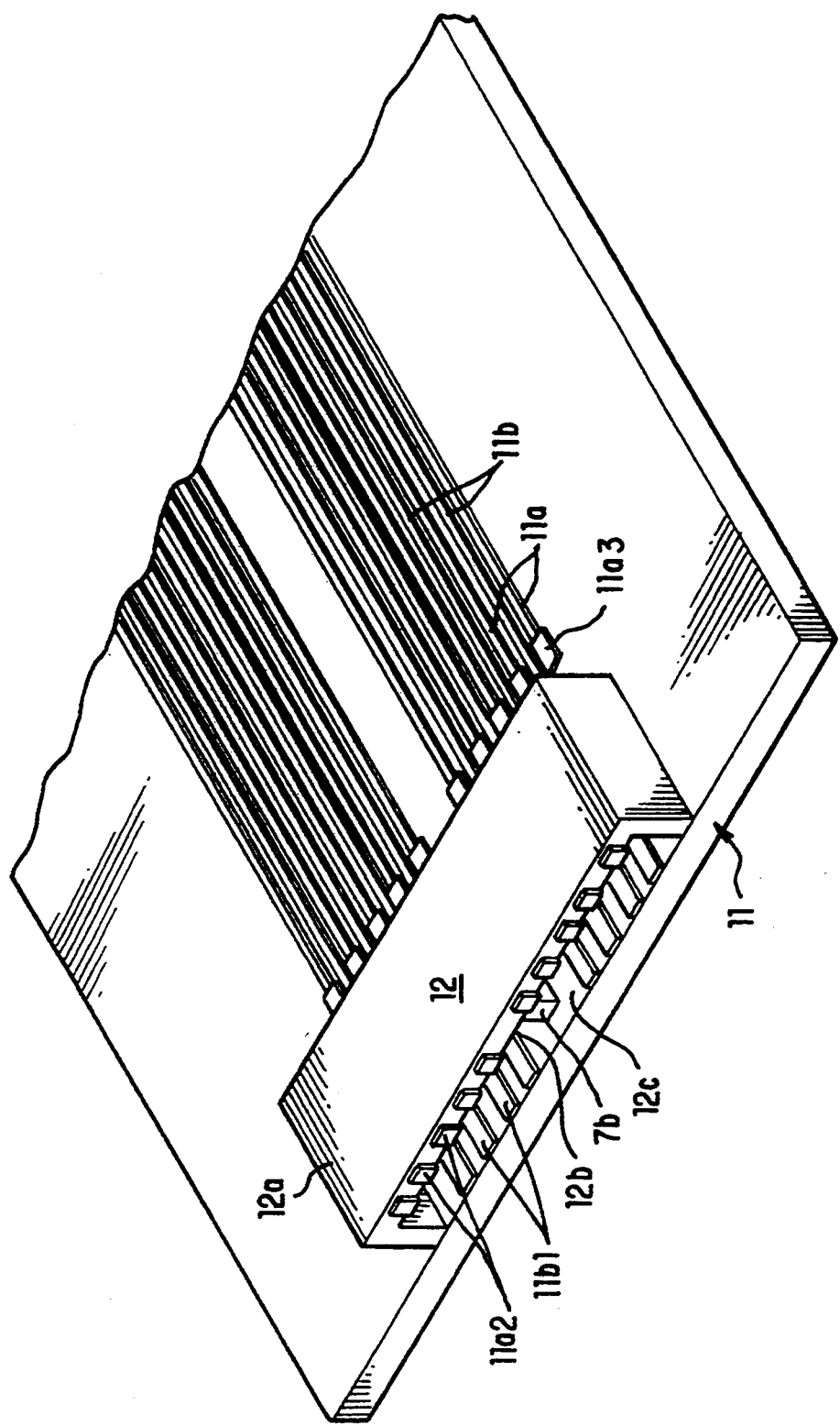
FIG. 2 is an isometric illustration of the electrical connector receptacle of FIG. 1 viewed from a different angle.

The electrical connector receptacle 12 is pictured in FIGS. 1 and 2 and is detailed in FIGS. 4 and 8 through 12. The electrical connector receptacle 12 has opposite electrical receptacle faces 12b and 12c. The electrical receptacle face 12c is the end face of the printed circuit board 11. The layout of the printed circuit board 11 is best seen in FIG. 4. Here, printed circuit traces 11 are terminated in contact pads in different locations on the printed circuit board 11. Alternate pairs of printed circuit traces 11a are terminated in contact pads 11a1 at a location on the printed circuit board removed from the end face 12c of the printed circuit board 11. Intermediate printed circuit traces 11b extend between the contact pads 11a1 and terminate in contact pads 11b1 located in the end face of the printed circuit board 11.

Figure 9:
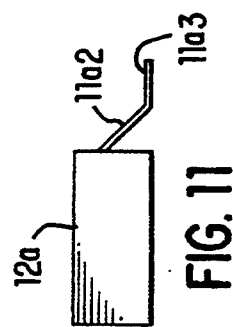
Figure 10:
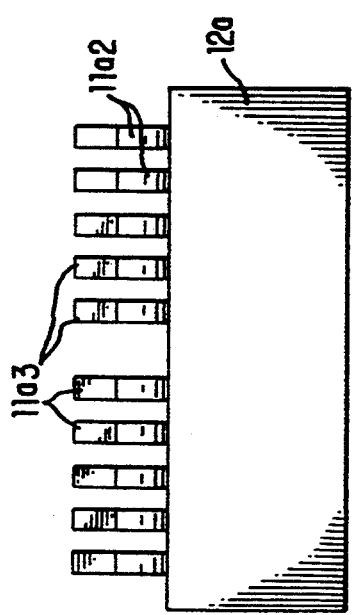
Figure 11:
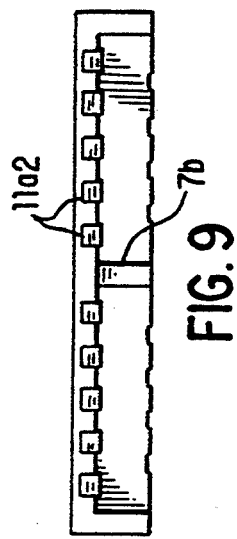
Figure 12:
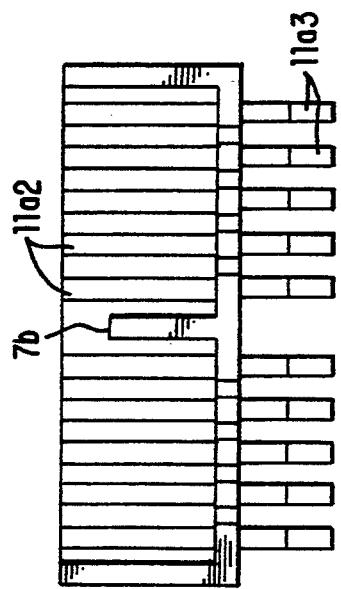

A receptacle housing section 12a with depending end walls and a rear wall is secured to the printed circuit in a position over the printed circuit board end face 12c. Its upper inner surface defines the upper receptacle face 12b. Electrical connector strips 11a2 are secured to the upper receptacle face 12b as seen in FIGS. 2, 9, 10 ;and 12, and, as particularly seen in FIG. 11 extend from the rear of the receptacle housing 12a deflecting downwardly and terminating in contact pads 11a3. The electrical connector strips 11a2 are aligned with the alternate printed circuit traces 11a, and, as best seen in FIGS. 1 and 2 the contact pads 11a3 engage the contact pads 11a1 of the printed circuit traces 11a which completes the circuit connections to these printed circuit traces from the electrical connector strips in the upper electrical receptacle face 12b.

A key 7b, FIGS. 2, 9, 10 and 12, in the upper face 12b of the receptacle housing 12a is aligned with a key slot, 7a FIG. 1, in the electrical connector plug 2. Thus at the time the electrical connector plug 2 is inserted into the opening in the electrical connector receptacle 12, defined between the opposite receptacle faces 12b and 12c, the contact pads 5a1 are aligned with and in contact with the electrical connector strips 11a2 in the upper opposite electrical receptacle face 12b of the receptacle 12 and the lower contact pads 5b1 on the bottom electrical connector plug surface; 1b are aligned with the contact pads 11b1 which are adaptable with the printed circuit tracers 11b in the bottom electrical receptacle face 12c of the electrical receptacle 12.

The overall thickness of the electrical connector plug 2 need be little more than 3 to 4 time the thickness of the mylar strip 3. The overall thickness of the electrical connector which is measured from the bottom side of the printed circuit board 11 to the top side of the receptacle housing 12a in one practical embodiment of this invention, is less than 2 millimeters, and, in fact, need be no more than 1.7 millimeters.

The structural design is both cost effective and easily fabricated. By utilizing existing circuit parts as part of the electrical connector, the parts inventory for fabricating the connector is reduced. Overall, the electrical connector is cost effective.

What is claimed is:

1. An electrical connector assembly, comprising:
   a. a substantially planar flexible circuit having laterally spaced flexible circuit traces, said planar flexible circuit having a folded end portion comprising spaced planar flexible circuit sections defining an electrical connector plug having opposite outer electrical connector plug surfaces;
   b. respective contact pads aligned in the paths of respective alternate flexible circuit traces on one outer electrical connector plug surface terminating thereat individual said alternate flexible circuit traces in a position adjacent the end of said folded end portion;
   c. respective contact pads on the other outer electrical connector plug surface, aligned in the paths of and terminating thereat, individual intermediate flexible circuit traces which extend from a position between said alternate flexible circuit traces around said folded end portion;
   d. an electrical connector receptacle having confronting receptacle faces;
   e. a printed circuit board having an end face comprising one receptacle face;
   f. laterally spaced printed circuit traces on said printed circuit board, alternate printed circuit traces of said laterally spaced printed circuit traces terminating in respective contact pads aligned in the paths of said alternate printed circuit traces at said end face, intermediate printed circuit traces between said alternate printed circuit traces terminating in respective contact pads, aligned with said intermediate circuit traces, at a location on said printed circuit board removed inwardly from said end face;
   g. a receptacle housing mounted to said printed circuit board, said receptacle housing having an inner receptacle face spaced from and confronting said end face of said printed circuit board and defining with said end face an electrical connector receptacle opening for receiving a complementary electrical plug, and
   h. electrical connector strips mounted to said inner receptacle face of said receptacle housing in alignment with said intermediate circuit traces and connected to said contact pads of said intermediate printed circuit traces.

2. The electrical connector plug according to claim 1, comprising:
   a. a spacer disposed between and joined to said spaced planar flexible circuit sections.

3. The electrical connector plug according to claim 2, in which:
   said spacer comprises an elastomeric material for resiliently spacing said spaced planar flexible circuit sections.

* * * * *